US012683127B2

(12) United States Patent　　　(10) Patent No.:　US 12,683,127 B2
Yeh et al.　　　　　　　　　　　(45) **Date of Patent:　*Jul. 14, 2026**

(54) CHEMICAL VAPOR DEPOSITION APPARATUS WITH CLEANING GAS FLOW GUIDING MEMBER

(71) Applicant: Taiwan Semiconductor Manufacturing Company, Ltd., Hsinchu (TW)

(72) Inventors: Chih-Hung Yeh, Tainan City (TW); Tsung-Lin Lee, Tainan City (TW); Yi-Ming Lin, Tainan City (TW); Sheng-Chun Yang, Tainan City (TW); Tung-Ching Tseng, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 79 days.

This patent is subject to a terminal disclaimer.

(21) Appl. No.: 18/062,068

(22) Filed: Dec. 6, 2022

(65) Prior Publication Data

US 2023/0098570 A1　　Mar. 30, 2023

Related U.S. Application Data

(63) Continuation of application No. 16/021,448, filed on Jun. 28, 2018, now Pat. No. 11,532,459.

(Continued)

(51) Int. Cl.
*H01J 37/32*　　　(2006.01)
*C23C 16/44*　　　(2006.01)
*C23C 16/455*　　(2006.01)

(52) U.S. Cl.
CPC .. *H01J 37/32449* (2013.01); *H01J 37/32862* (2013.01); *C23C 16/4405* (2013.01); *C23C 16/4408* (2013.01); *C23C 16/45565* (2013.01); *C23C 16/45578* (2013.01); *C23C 16/45587* (2013.01)

(58) Field of Classification Search
CPC ............ C23C 16/4405; C23C 16/4408; C23C 16/45521; C23C 16/45561; C23C 16/45565; C23C 16/45568; C23C 16/45578; C23C 16/4558; C23C 16/45591; C23C 16/4585; C23C 16/45587; H01J 37/3244; H01J 37/32449; H01J 37/32862; C30B 25/14
See application file for complete search history.

(56) References Cited

U.S. PATENT DOCUMENTS 4,512,283 A　　4/1985　Bonifield
4,671,806 A　　6/1987　Stil
(Continued)

*Primary Examiner* — Kurt Sweely
(74) *Attorney, Agent, or Firm* — McClure, Qualey & Rodack, LLP

(57) ABSTRACT

A chemical vapor deposition (CVD) apparatus is provided. The CVD apparatus includes a CVD chamber including multiple wall portions. A pedestal is disposed inside the CVD chamber, configured to support a substrate. A gas inlet port is disposed on one of the wall portions and below a substrate support portion of the pedestal. In addition, a gas flow guiding member is disposed inside the CVD chamber, coupled to the gas inlet port, and configured to dispense cleaning gases from the gas inlet port into the CVD chamber.

20 Claims, 13 Drawing Sheets

Related U.S. Application Data

(60) Provisional application No. 62/583,561, filed on Nov. 9, 2017.

(56) References Cited

U.S. PATENT DOCUMENTS

| 4,854,263 | A | * | 8/1989 | Chang | C23C 16/345 |
| | | | | | 118/728 |
| 4,854,266 | A | | 8/1989 | Simson | |
| 5,460,484 | A | * | 10/1995 | Yagi | F04D 29/4213 |
| | | | | | 415/161 |
| 5,609,721 | A | | 3/1997 | Tsukune | |
| 5,711,815 | A | * | 1/1998 | Lee | C23C 16/45521 |
| | | | | | 118/728 |
| 6,050,216 | A | | 4/2000 | Szapucki | |
| 6,325,948 | B1 | * | 12/2001 | Chen | H01J 37/32862 |
| | | | | | 134/1.1 |
| 6,590,344 | B2 | * | 7/2003 | Tao | C23C 16/45574 |
| | | | | | 315/111.21 |
| 8,282,768 | B1 | * | 10/2012 | Smargiassi | H01L 21/6719 |
| | | | | | 156/345.55 |
| 2003/0186517 | A1 | | 10/2003 | Takagi | |
| 2007/0163498 | A1 | | 7/2007 | Clark | |
| 2009/0156013 | A1 | * | 6/2009 | Yousif | H01J 37/3244 |
| | | | | | 156/345.35 |
| 2014/0030433 | A1 | | 1/2014 | Ranish | |
| 2014/0116620 | A1 | * | 5/2014 | Kuwabara | C23C 16/509 |
| | | | | | 156/345.24 |
| 2014/0357058 | A1 | | 12/2014 | Takagi | |
| 2016/0083837 | A1 | * | 3/2016 | Narushima | C23C 16/34 |
| | | | | | 118/725 |
| 2017/0159176 | A1 | * | 6/2017 | Zhang | C23C 16/34 |
| 2019/0017168 | A1 | * | 1/2019 | Takagi | H01L 21/67126 |

* cited by examiner

17'

17'

1000

Providing a gas flow guiding member inside the CVD chamber and coupling the gas flow guiding member to a gas inlet port disposed on one of wall portions of the CVD chamber and below a substrate support portion of a pedestal inside the CVD chamber, wherein the gas flow guiding member has a plurality of gas outlet holes

1001

Flowing cleaning gases to the gas inlet port

1002

Dispensing the cleaning gases into the CVD chamber through the gas outlet holes of the gas flow guiding member to clean the wall portions in a lower region of the CVD chamber between the substrate support portion and a bottom wall of the wall portions

CHEMICAL VAPOR DEPOSITION APPARATUS WITH CLEANING GAS FLOW GUIDING MEMBER

CROSS REFERENCE TO RELATED APPLICATIONS

This application is a Continuation of U.S. patent application Ser. No. 16/021,448, filed on Jun. 28, 2018, which claims the benefit of U.S. Provisional Patent Application No. 62/583,561, filed on Nov. 9, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

In the formation of multi-level integrated circuit (IC) devices, a major portion of the manufacturing cycle involves using chemical vapor deposition (CVD) processes to deposit material layers. In particular, the deposition of oxide insulating layers, such as inter-metal dielectric (IMD) layers, is performed several times in the formation of a multi-level integrated circuit device. A film is formed not only on a substrate but also on inner walls of a CVD chamber. In addition, the chemical byproducts and unreacted reagents of such deposition processes are mostly evacuated from the chamber by an exhaust pump, but some residue is unavoidably deposited on the inner walls of the CVD chamber. Thus, the CVD chamber is cleaned periodically to remove unwanted films or residues on the inner walls of the CVD chamber.

Although existing apparatus and methods for cleaning the CVD chamber have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which:

FIG. 11 is a simplified flowchart of a method for cleaning a CVD chamber, in accordance with some embodiments.

DETAILED DESCRIPTION

Figure 1:
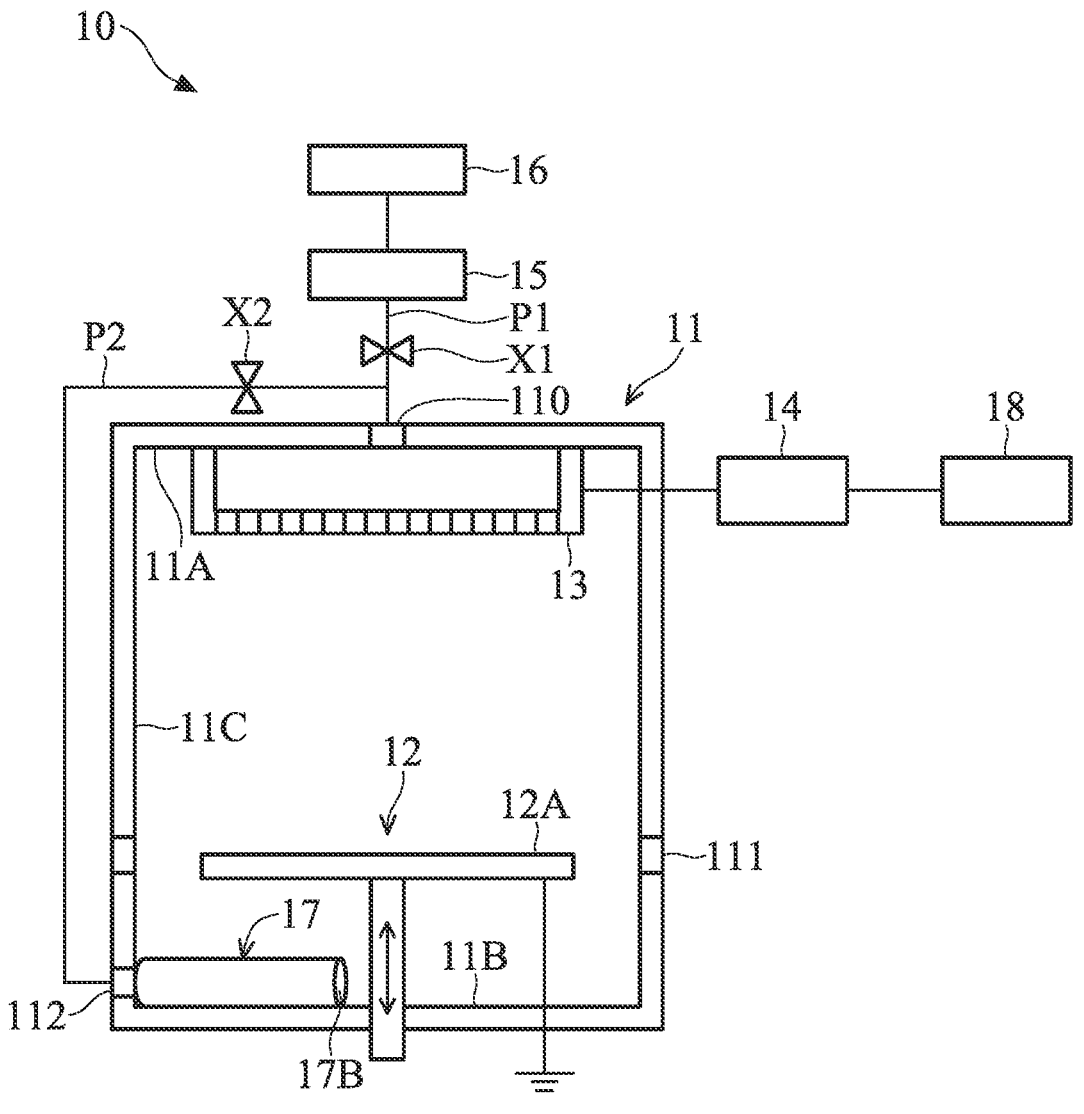
FIG. 1 is a schematic side view of a chemical vapor deposition (CVD) apparatus, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements.

FIG. 1 is a schematic side view of a chemical vapor deposition (CVD) apparatus 10, in accordance with some embodiments. The CVD apparatus 10 not only can be used to deposit material on a substrate in CVD processes but also is configured to perform a cleaning process to remove films or residues from the inner walls of a vacuum chamber 11 of the CVD apparatus 10, for example, before or after the CVD processes. It should be understood that some elements that are not related to the cleaning process (but only the CVD process) are not depicted in FIG. 1 and the description thereof will be omitted, for the purpose of simplicity and clarity.

Referring to in FIG. 1, the CVD apparatus 10 includes a vacuum chamber (also referred to as a CVD chamber) 11 that includes multiple wall portions, such as a top wall 11A, a bottom wall 11B, and a sidewall 11C between and connected to the top wall 11A and the bottom wall 11B. In some embodiments, the CVD chamber 11 is cylindrical. Unreacted chemical reagents, byproducts, or other residues can deposit on the wall portions of the CVD chamber 11 during the CVD process and become a source of particulate contamination.

A pedestal 12 is disposed inside the CVD chamber 11 to support a substrate such as a semiconductor wafer. The substrate is positioned on a substrate support portion 12A of the pedestal 12 in the CVD chamber 11, during CVD processing. In some embodiments, the substrate support portion 12A can be an electrostatic chuck (ESC) that can secure the substrate to the pedestal 12 by electrostatic force. In some embodiments, a temperature regulator (not shown) is provided in the substrate support portion 12A to regulate the temperature of the substrate placed thereon. In some embodiments, the pedestal 12 can be moved controllably between a lower (substrate) loading/off-loading position (depicted in FIG. 1) and an upper (CVD) processing position that is away from the bottom wall 11B and adjacent to a gas distribution showerhead 13 disposed adjacent to the top wall 11A of the CVD chamber 11.

In some embodiments, the gas distribution showerhead 13 is affixed to the top wall 11A, substantially parallel to the substrate support portion 12A. During a CVD chamber cleaning process, the gas distribution showerhead 13 is configured to uniformly dispense cleaning gases (e.g., cleaning plasmas) to clean the wall portions in the upper (e.g., cylindrical) region of the CVD chamber 11 roughly above the substrate support portion 12A (i.e., between the substrate support portion 12A and the top wall 11A), during the cleaning process. It should be noted that a substrate is not positioned on the substrate support portion 12A during the cleaning process. In some embodiments, the gas distribution showerhead 13 is also used to uniformly dispense processing gases to the substrate positioned on the heated substrate support portion 12A, during CVD processing.

In some embodiments, as shown in FIG. 1, a radio frequency (RF) generator 14 is configured to apply RF power to the gas distribution showerhead 13 and the substrate support portion 12A (i.e., the gas distribution showerhead 13 serves as an upper electrode, and the substrate support portion 12A serves as a lower electrode). Consequently, plasmas are formed between the gas distribution showerhead 13 and the substrate support portion 12A to improve or enhance the performance (e.g., efficiency) of the cleaning process (or the CVD process). In some instances shown in FIG. 1, the RF generator 14 is electrically coupled to and controlled by a controller 18. In some other embodiments, the RF generator 14 can be omitted.

Cleaning gases (e.g., cleaning plasmas) may be introduced into the CVD chamber 11 through a (first) gas inlet port 110 disposed on the top wall 11A of the CVD chamber 11, and may flow through the gas distribution showerhead 13 to clean the inner walls in the upper region of the CVD chamber 11. In some embodiments, as shown in FIG. 1, a remote plasma generator 15 is disposed outside the CVD chamber 11 and in fluid communication with the CVD chamber 11 via a valve X1 and a pipe P1. A cleaning gas source 16 is connected to the remote plasma generator 15, configured to supply cleaning gases to the remote plasma generator 15. The cleaning gases from the cleaning gas source 16 may be excited by RF power from the remote plasma generator 15 to form cleaning plasmas.

Although not shown in FIG. 1, a gas flow controller (e.g., a mass flow controller or pressure controller) is connected to the pipe P1 to measure and control the flow rate of the cleaning plasmas therein. In some other embodiments, the remote plasma generator 15 can be omitted, and the cleaning gases from the cleaning gas source 16 are used to clean the inner walls of the CVD chamber 11.

In some embodiments, the cleaning gas source 16 supplies the cleaning gases including fluorine-containing gases, inert gases or combinations thereof. The fluorine-containing gases comprise nitrogen trifluoride (NF3), hexafluoroethane (C2F6), tetrafluoromethane (CF4), fluoroform (CHF3), fluorine (F2), hydrogen fluoride (HF) or combinations thereof. The inert gases comprises argon (Ar), helium (He), neon (Ne), krypton (Kr), xenon (Xe) or combinations thereof. In some embodiments, the fluorine radicals are produced by a plasma deposition of the fluorine-containing gases (excited by the remote plasma generator 15). In particular, the radicals are more reactive than the original cleaning gases from the cleaning gas source 16 and can be used to remove unwanted deposits containing silicon, silicon oxide or silicon nitride formed by the CVD process.

In some embodiments, unwanted material deposits also form on the wall portions in the lower (e.g., cylindrical) region of the CVD chamber 11 roughly below the substrate support portion 12A (i.e., between the substrate support portion 12A and bottom wall 11B) during CVD processing, to become a source of particulate contamination. The CVD apparatus 10 can further include the features described below, in order to dean the wall portions in the lower region of the CVD chamber 11 during the cleaning process.

In some embodiments, another gas inlet port 112 (or a second gas inlet port 112) is disposed on one of the wall portions of the CVD chamber 11 and below the substrate support portion 12A of the pedestal 12. For example, as shown in FIG. 1, the gas inlet port 112 is disposed on the sidewall 11C of the CVD chamber 11 adjacent to the bottom wall 11B. In some other embodiments, the gas inlet port 112 can be disposed on the bottom wall 11B. A pipe P2 with a valve X2 is in fluid communication with the pipe P1 (and the remote plasma generator 15 or the cleaning gas source 16) and the gas inlet port 112. The cleaning plasmas from the remote plasma generator 15 (or the cleaning gases from the cleaning gas source 16) may be introduced into CVD chamber 11 through the gas inlet port 112 to clean the wall portions in the lower region of the CVD chamber 11. Although not shown in FIG. 1, a gas flow controller a mass flow controller or pressure controller) is connected to the pipe P2 to measure and control the flow rate of the cleaning plasmas or gases therein.

Furthermore, the CVD apparatus 10 includes a gas flow guiding member 17 disposed inside the CVD chamber 11 and coupled to the (second) gas inlet port 112. The gas flow guiding member 17 is configured to redirect the flow of the cleaning plasmas or gases from the gas inlet port 112 into the lower region of the CVD chamber 11. In some embodiments, such redirection of flow can allow the gas flow guiding member 17 to improve the flow field uniformity of the cleaning plasmas or gases in the lower region of the CVD chamber 11 (which will be further illustrated later), thereby improving the cleaning uniformity of the cleaning process. In some embodiments, the gas flow guiding member 17 can be made of metal, quartz, ceramic materials, or other materials that can withstand eat and attack of chemical reagents in CVD processes. Example metals include aluminum and stainless steel. In some implementations, the gas flow guiding member can include a metal structure and a coating or lining formed of quartz or ceramic materials.

Figure 2:
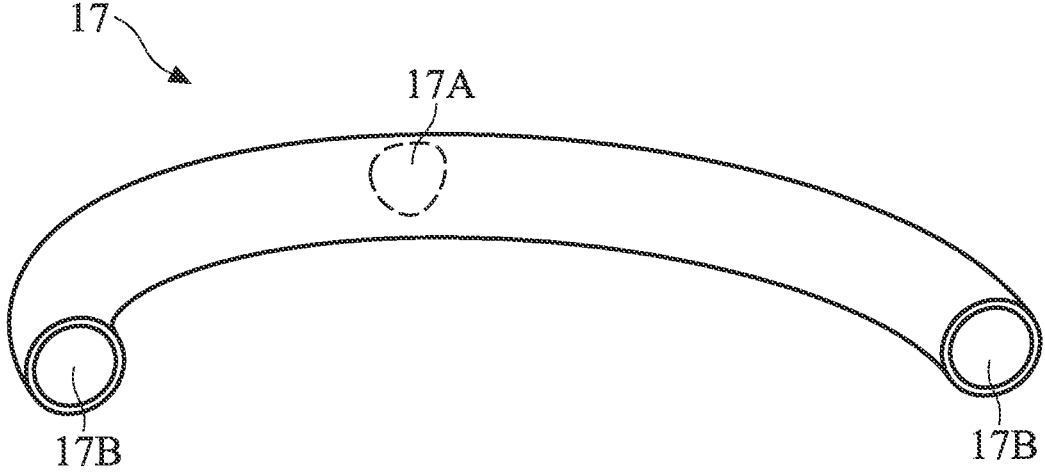
FIG. 2 is a perspective view of a gas flow guiding member having one gas inlet hole and two gas outlet holes, in accordance with some embodiments.
Figure 3:
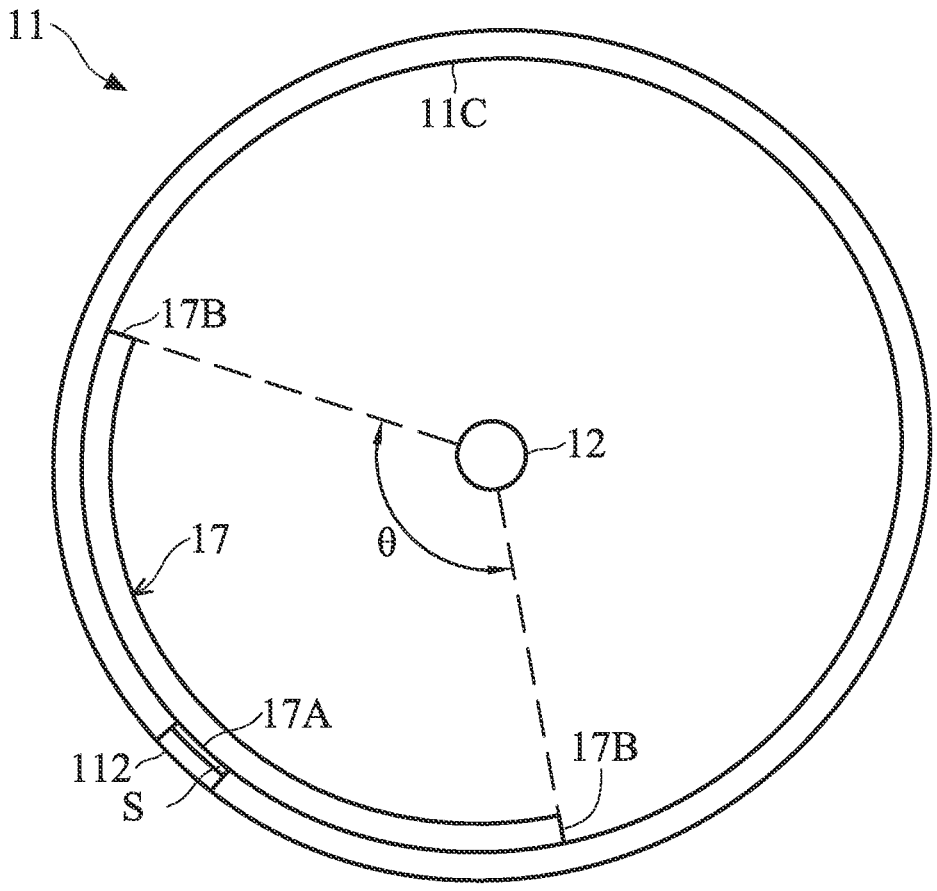
FIG. 3 is a schematic top-down view of a part of the CVD apparatus in FIG. 1.

FIG. 2 is a perspective view of a gas flow guiding member 17, in accordance with some embodiments. FIG. 3 is a schematic top-down view of a part of the CVD apparatus in FIG. 1 which illustrates the configuration of the gas flow guiding member 17 in the CVD chamber 11.

Referring to FIGS. 2 and 3, the gas flow-guiding member 17 is an elongated tubular structure with a circular cross-section (however, the shape of the cross-section can be modified or changed to another optional shape in different embodiments). In the embodiments represented in FIGS. 2 and 3, the gas flow guiding member 17 defines or has a gas inlet hole 17A and two (first) gas outlet holes 17B that are disposed at both ends of the gas flow guiding member 17 along the longitudinal direction. The gas inlet hole 17A is disposed between the two gas outlet holes 17B, connected to the gas inlet port 112, and configured to receive the cleaning plasmas or gases from the gas inlet port 112. In some embodiments, the gas inlet hole 17A is disposed in the middle of the gas flow guiding member 17 such that the gas inlet hole 17A/the gas inlet port 112 is equidistant from each of the two gas outlet holes 17B.

In some embodiments, a peripheral sealing member S (as depicted in FIG. 3), such as an O-ring, is also provided to seal the junction of the gas inlet port 112 and the gas inlet hole 17A to avoid leakage. By bifurcating the flow from the single gas inlet port 112 into flow from two spaced-apart gas outlet holes 17B, the gas flow guiding member 17 can result in a more uniform distribution of cleaning plasmas or gases in the lower region of the CVD chamber 11.

As shown in FIGS. 2 and 3, the gas flow guiding member 17 is curved and extends along the shape of the (circular) sidewall 11C of the CVD chamber 11. In some embodiments where the CVD chamber 11 is circular from a top view, the gas flow guiding member 17 can extend along the sidewall 11C through a portion of a circumference of the CVD chamber. In those embodiments, with respect to a center of the pedestal 12, the two gas outlet holes 17B can form a predetermined angle θ, such as about 120 degrees (as depicted in FIG. 3) or other suitable angle (e.g. 180 degrees, 240 degrees, etc.).

In addition, as shown in FIG. 1, the gas flow guiding member 17 is disposed below the substrate support portion 12A of the pedestal 12. In some embodiments, the gas flow guiding member 17 is disposed adjacent to and substantially parallel to the bottom wall 11B of the CVD chamber 11 (i.e., the distance between one of the gas out holes 17B and the bottom wall 11B is the same as the distance between the other of the gas outlet holes 17B and the bottom wall 11B). Alternatively, the gas flow guiding member 17 may be disposed on the bottom wall 11B directly, for example, when the gas inlet port 112 is formed on the bottom wall 11B.

Figure 4A:
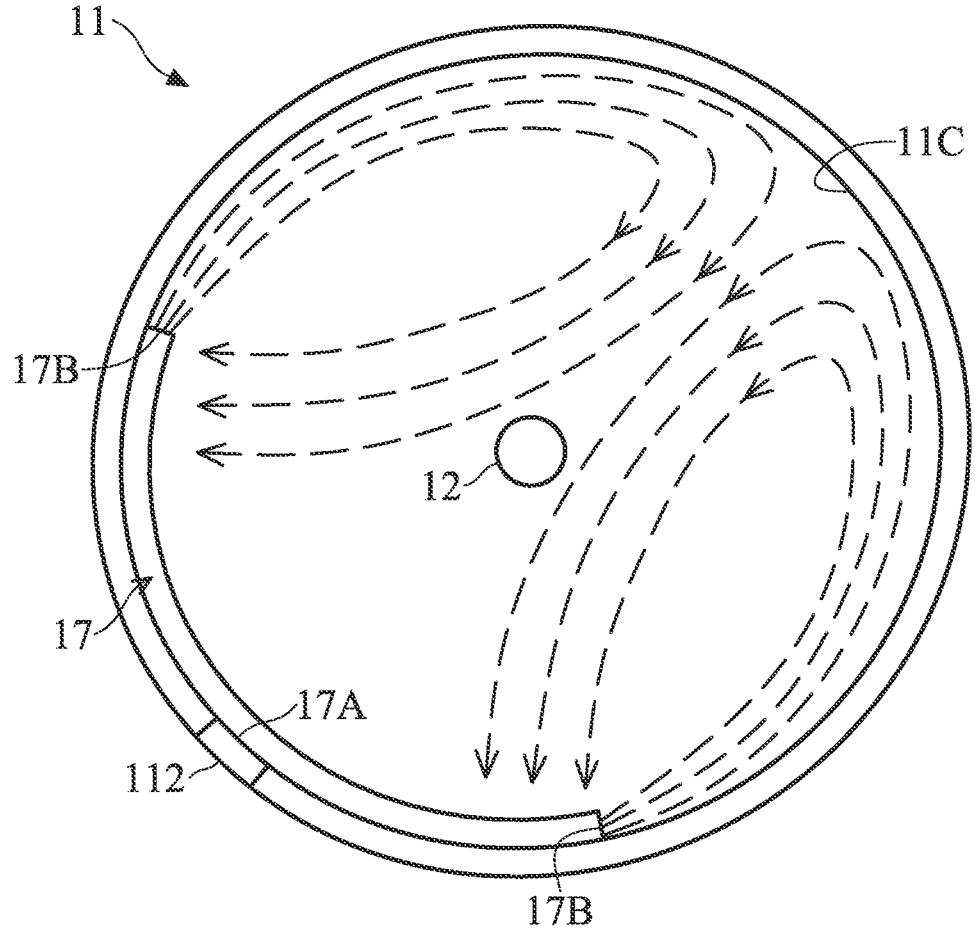
FIG. 4A is a schematic view illustrating the flow field distribution of the cleaning plasmas or gases in the lower region of the CVD chamber with a gas flow guiding member redirecting the cleaning plasmas or gases, in accordance with some embodiments.
Figure 4B:
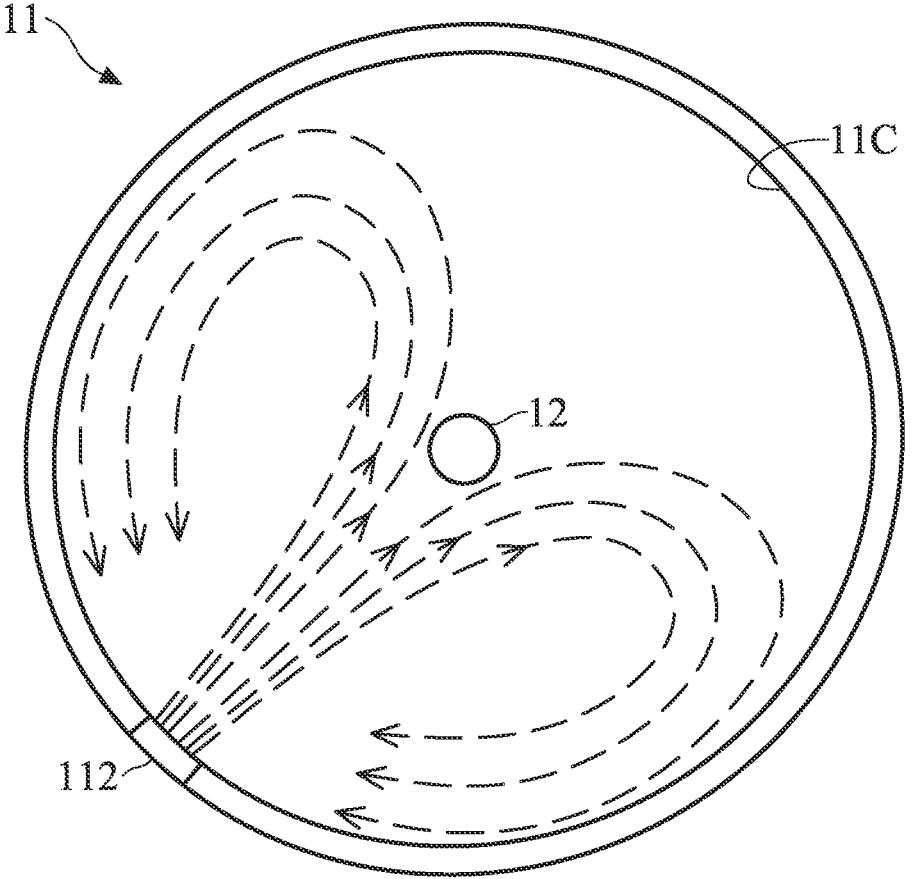
FIG. 4B is a schematic view illustrating the flow field distribution of the cleaning plasmas or gases in the lower region of the CVD chamber without a gas flow guiding member redirecting the cleaning plasmas or gases, in accordance with some embodiments.

Through the above configuration, the gas flow guiding member 17 changes the flow field of the cleaning plasmas or gases (from the gas inlet port 112) in the lower region of the CVD chamber 11. FIG. 4A is a schematic view illustrating the flow field distribution (depicted in dashed lines) of the cleaning plasmas or gases in the lower region of the CVD chamber 11 with the gas flow guiding member 17 redirecting the cleaning plasmas or gases. Because the two gas outlet holes 17B are positioned on different sides of a straight line between the gas inlet port 112 and the pedestal 12, the cleaning plasma and gases can go around the pedestal 12. As a comparison, FIG. 4B is a schematic view illustrating the flow field distribution (depicted in dashed lines) of the cleaning plasmas or gases in the lower region of the CVD chamber 11 without the gas flow guiding member 17 redirecting the cleaning plasmas or gases from the gas inlet port 112. As illustrated in FIG. 4B, without the gas flow guiding member 17, the flow field distribution can be blocked or restricted by the presence of the pedestal 12.

From the comparison of FIGS. 4A and 4B, it can be seen that the flow of the cleaning plasmas or gases from the gas inlet port 112 (FIG. 4B) may be blocked by the pedestal 12 centered within the CVD chamber 11 and will not reach the portion of the sidewall 11C located on the opposite side of the gas inlet port 112 with relative to the pedestal 12. On the contrary, the cleaning plasmas or gases from the gas outlet holes 17B of the gas flow guiding member 17 in FIG. 4A can flow around the pedestal 12 and reach the portion of the sidewall 11C located on the opposite side of the gas inlet port 112. Consequently, the gas flow guiding member 17 of the present disclosure can improve the flow field uniformity of the cleaning plasmas or gases in the lower region of the CVD chamber 11, as well as the cleaning uniformity of the cleaning process. For example, unwanted material deposits in the interstice (not shown) on the portion of the sidewall 11C located on the opposite side of the gas inlet port 112 can be successfully removed by the cleaning process.

Figure 5:
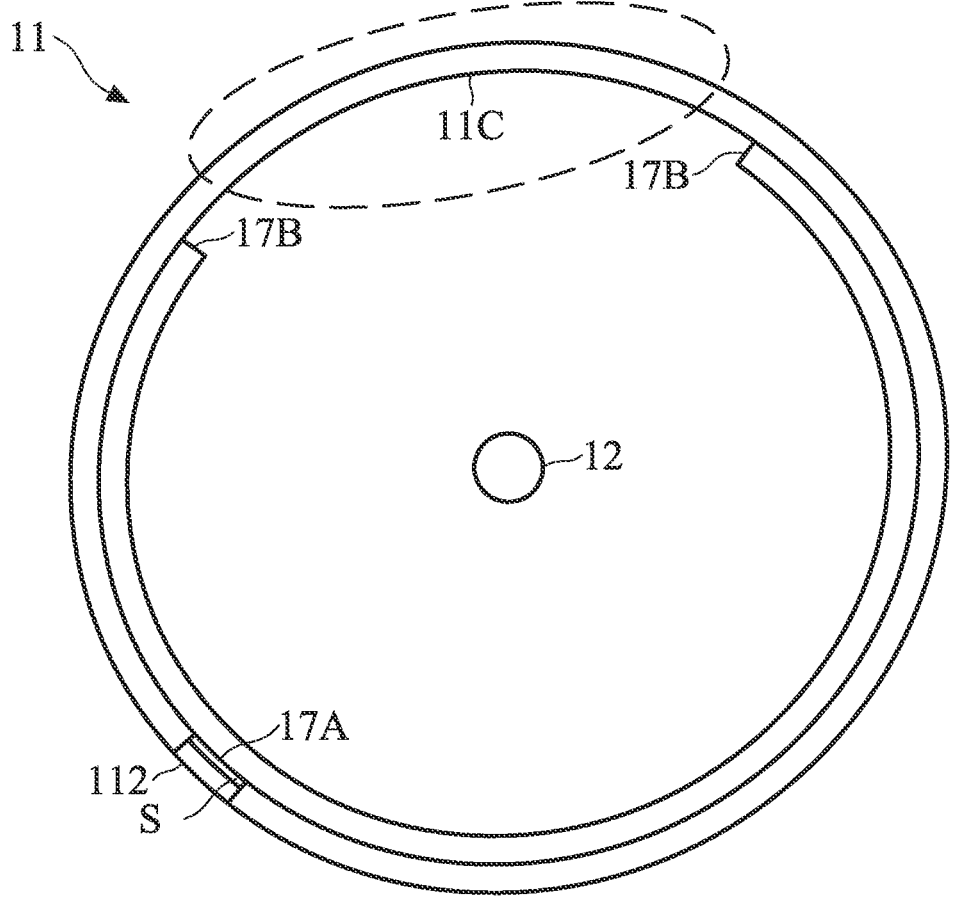
FIG. 5 is a schematic view illustrating a gas flow guiding member with gas outlet holes positioned at different distances from the gas inlet port, in accordance with some embodiments.

Many variations and modifications can be made to embodiments of the disclosure. For example, FIG. 5 is a schematic view illustrating that the two gas outlet holes are not equidistant from the gas inlet hole 17A/the gas inlet port 112 (i.e., the gas inlet hole 17A is not disposed in the middle of the gas flow guiding member 17), in accordance with some embodiments.

It should be noted that the location of the two gas outlet holes 17B of the gas flow guiding member 17 may be arranged based on where unwanted residues are most easily deposited on the sidewall 11C, in some embodiments. For example, the gas flow guiding member 17 may be configured so that the two gas outlet holes 17B are both close to the portion of the sidewall 11C where unwanted residues are most easily deposited thereon (e.g., the portion of the sidewall 11C circled in FIG. 5). Accordingly, the cleaning plasmas or gases from the gas outlet holes 17B successfully flow through and clean such portion of the sidewall 11C. In some embodiments, the size or opening diameter of the two gas outlet holes 17B of the gas flow guiding member 17 may be the same or different.

Figure 6:
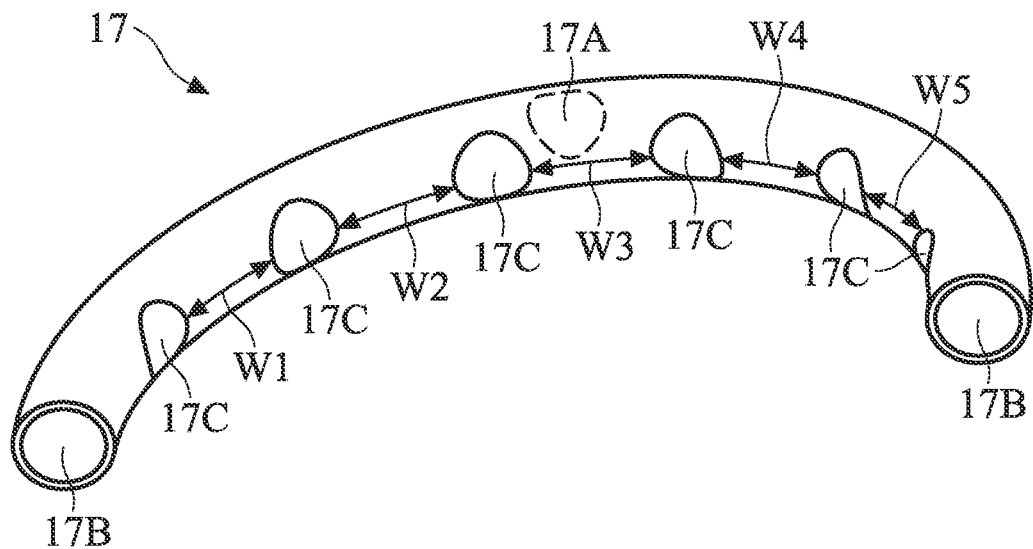
FIG. 6 is a perspective view of a gas flow guiding member having one gas inlet hole and more than two gas outlet holes, in accordance with some embodiments.

In some embodiments, as shown in FIG. 6, the gas flow guiding member 17 has one gas inlet hole 17A and more than two gas outlet holes that include two (first or end) gas outlet holes 17B and a number of (second) gas outlet holes 17C disposed between the two gas outlet holes 17B. The gas inlet hole 17A and the (second) gas outlet holes 17C may be disposed on opposite sides of the gas flow guiding member 17 (i.e., the gas inlet hole 17A is disposed on the side of the gas flow guiding member 17 facing the sidewall 11C, and the (second) gas outlet holes 17C are disposed on the side of the gas flow guiding member 17 facing the pedestal 12). Similar to the (first) gas outlet holes 17B, the (second) gas outlet holes 17C are configured to dispense the cleaning plasmas or gases to the lower region of the CVD chamber 11 and can improve the flow field (uniformity) of the cleaning plasmas or gases in the lower region of the CVD chamber 11.

In some embodiments, the location, number, size, and shape of the (second) gas outlet holes 17C can be changed or adjusted according to actual needs. For example, the size (or opening diameter) of the (second) gas outlet holes 17C may be designed to be different from (e.g., smaller than) or the same as the size (or opening diameter) of the (first) gas outlet holes 17B. In addition, the (second) gas outlet holes 17C may be arranged at equal intervals or unequal intervals (i.e., the spacing W1~W5 between adjacent gas outlet holes 17C is the same or different).

Figure 7:
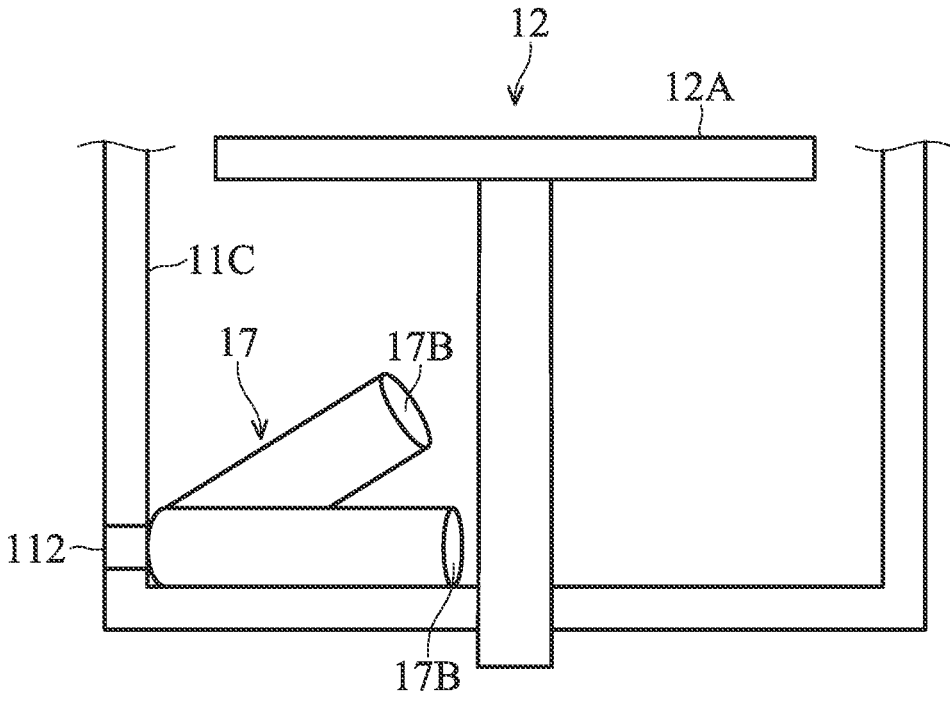
FIG. 7 is a schematic view illustrating a gas flow guiding member with gas outlet holes positioned at different distances from a bottom wall of a CVD chamber, in accordance with some embodiments.

In some embodiments, the two gas outlet holes 17B of the gas flow guiding member 17 can be positioned at different distances from the bottom wall 11B of the CVD chamber 11. For example, as shown in FIG. 7, the distance between one of the (first) gas out holes 17B and the bottom wall 11B is different from the distance between the other of the (first) gas outlet holes 17B and the bottom wall 11B. Consequently, unwanted material deposits on the wall portions (at different height positions) in the lower region of the CVD chamber 11 can be effectively removed by the cleaning process.

Figure 8A:
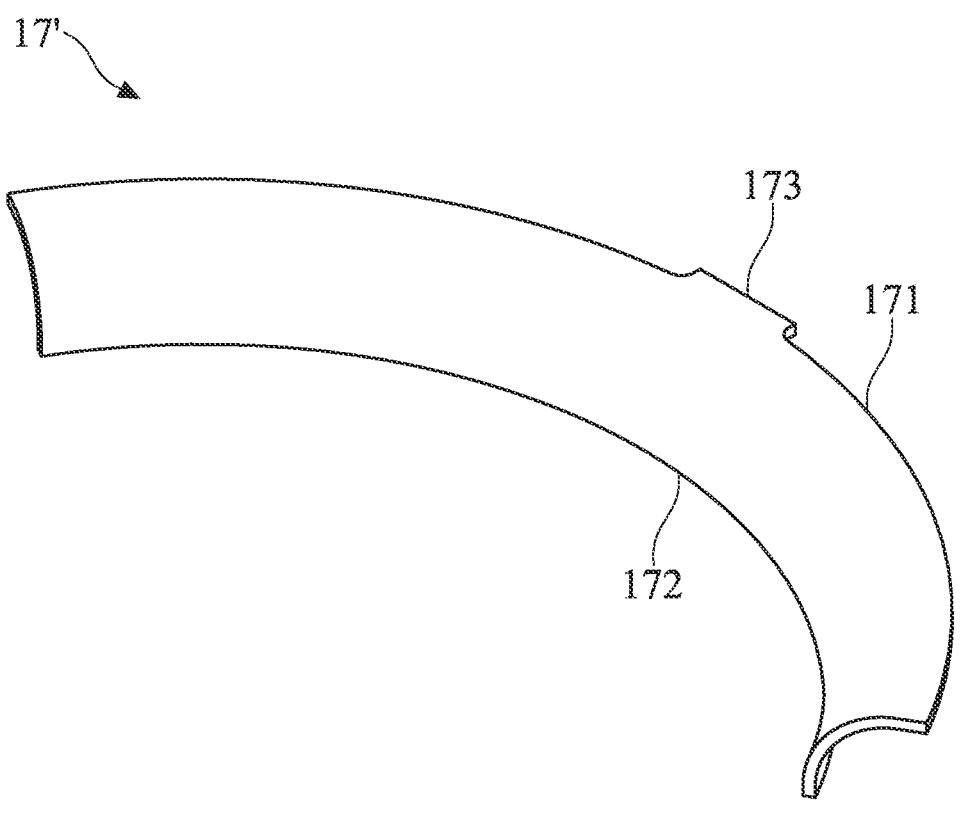
FIG. 8A is a perspective view of a non-tubular gas flow guiding member, in accordance with some embodiments.
Figure 8B:
FIG. 8B is a front view of the gas flow guiding member in FIG. 8A.
Figures 8C, 8D:
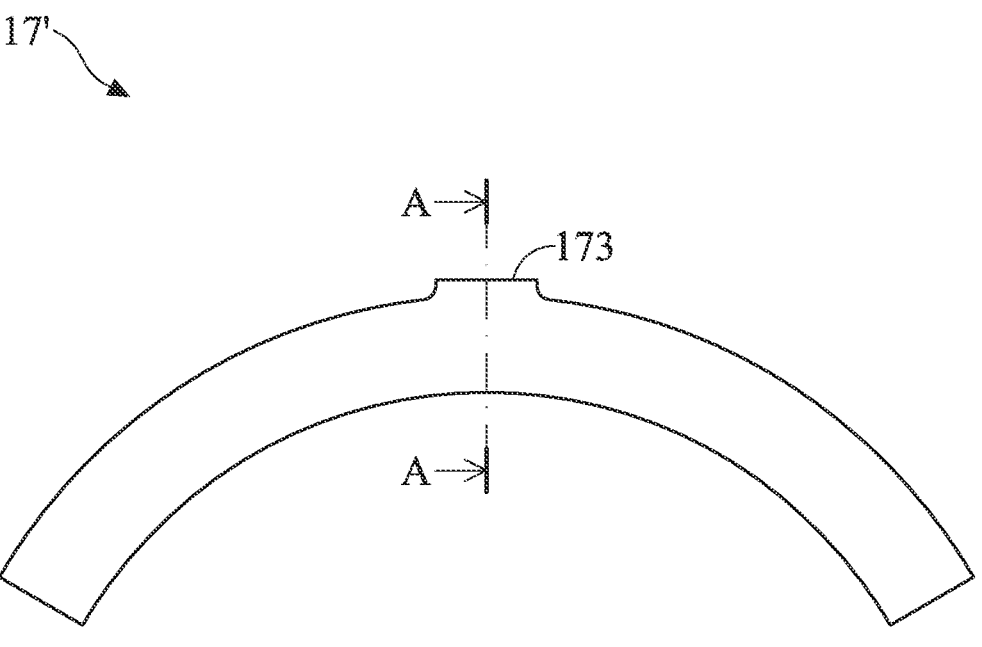
FIG. 8C is a top-down view of the gas flow guiding member in FIG. 8A.
FIG. 8D is a cross-sectional view taken along the line A-A in FIG. 8C.

FIG. 8A is a perspective view of a non-tubular gas flow guiding member 17', in accordance with some embodiments. Different from the tubular gas flow guiding member 17 in FIGS. 1-3, 4A, 5, and 6-7, the gas flow guiding member 17' is not tubular and does not have a closed cross-section. That is, the non-tubular gas flow guiding member 17' has an open-ended cross-section and a wall of the non-tubular gas flow guiding member 17' does not go fully around a longitudinal axis of the non-tubular gas flow guiding member 17'. In some embodiments, as shown in FIGS. 8B, 8C, and 8D, the cross-section of the entire elongated gas flow guiding member 17' is substantially the same in shape and size. For example, the cross-section of the gas flow guiding member 17' may be in quarter-circle shape or half-U shape.

Figure 9:
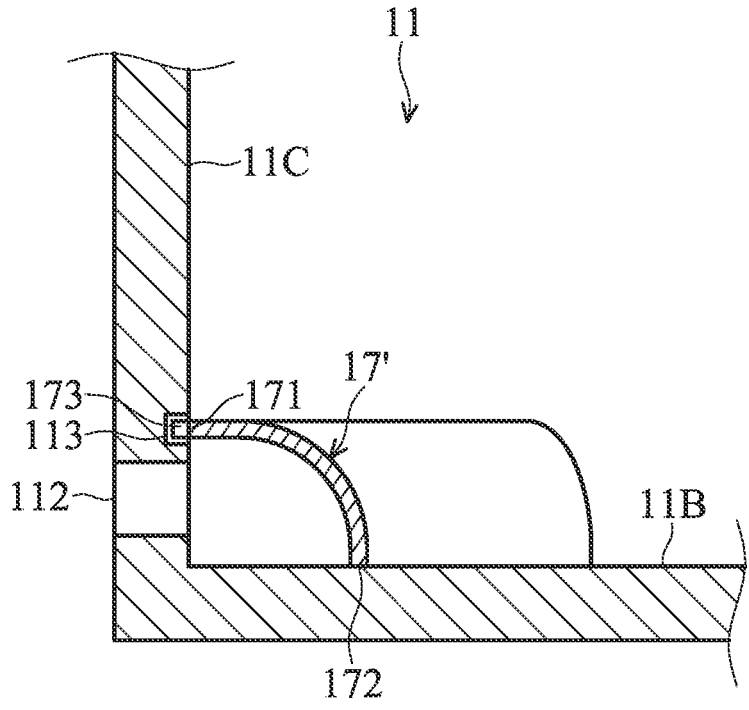
FIG. 9 is schematic cross-sectional view illustrating the gas flow guiding member in FIG. 8A positioned inside the CVD chamber, in accordance with some embodiments.

In some embodiments, the curved gas flow guiding member 17' extends along the sidewall 11C of the CVD chamber at a predetermined angle (such as about 120 degrees, 180 degrees, 240 degrees, etc.), similar to the configuration of the tubular gas flow guiding member 17 described above, and coupled to the gas inlet port 112 (see FIG. 9). In addition, as shown in FIG. 9, the gas flow guiding member 17' is positioned in the CVD chamber 11 so that its upper edge 171 and lower edge 172 (see also FIGS. 8A and 8B) are in contact with or sealingly engage the sidewall 11C and the bottom wall 11B, respectively. Accordingly, a gas flow channel is formed between the gas flow guiding member 17', the sidewall 11C, and the bottom wall 11B. Also, two (first) gas outlet holes 17B (FIG. 10) located at both ends of the gas flow channel (i.e., the gas flow guiding member 17') are formed or defined by the gas flow guiding member 17', the sidewall 11C, and the bottom wall 11B.

Figure 10:
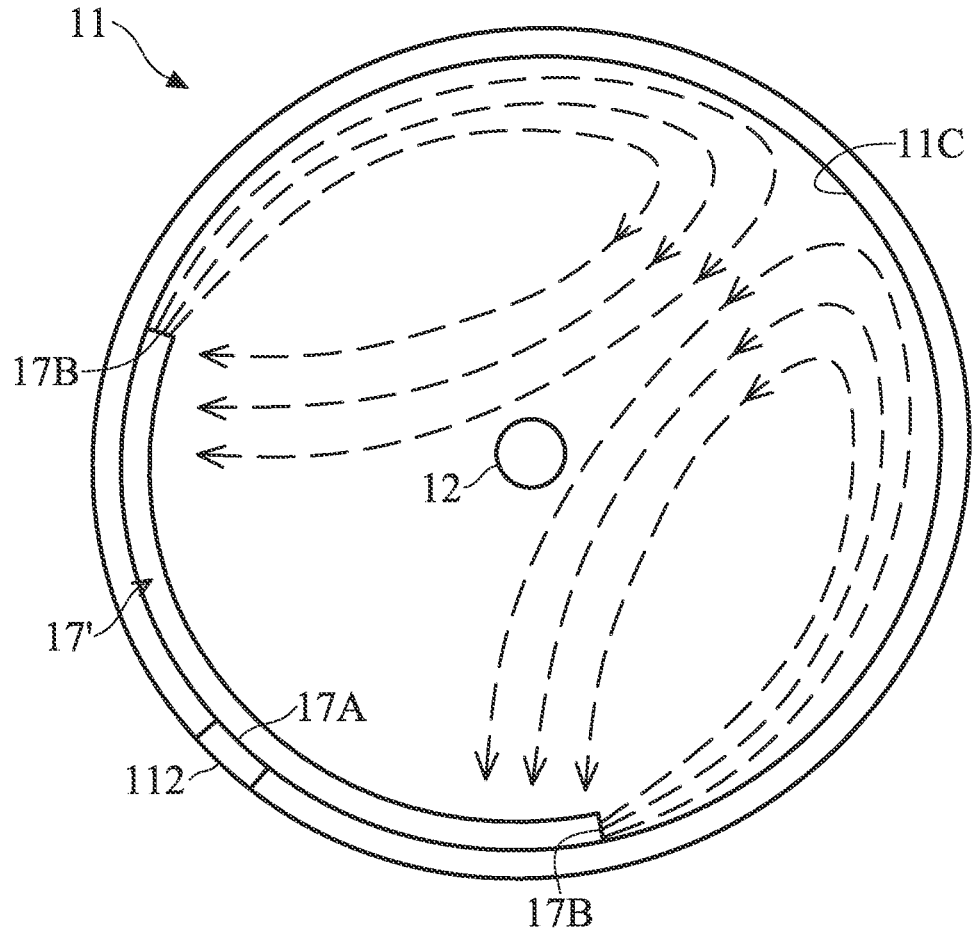
FIG. 10 is a schematic view illustrating the flow field distribution of the cleaning plasmas or gases in the lower region of the CVD chamber with the gas flow guiding member (in FIG. 8A) redirecting the cleaning plasmas or gases, in accordance with some embodiments.

As shown in FIG. 10, the cleaning plasmas or gases from the gas inlet port 112 are redirected by the gas outlet holes 17B of the gas flow guiding member 17' to reach the portion of the sidewall 11C located on the opposite side of the gas inlet port 112 with relative to the pedestal 12. Consequently, the flow field uniformity of the cleaning plasmas or gases in the lower region of the CVD chamber 11, as well as the cleaning uniformity of the cleaning process, can also be improved. Please note that while the gas outlet holes 17B of the gas flow guiding member 17' are referred to herein as holes for ease of reference, they are outlets or terminal ends of gas passages formed by and among the gas flow guiding member 17', the sidewall 11C and the bottom wall 11B.

It should be appreciated that the gas flow guiding member 17' also has a positioning protrusion 173 extending from its upper edge 171 (see FIGS. 8C and 8D), and the sidewall 11C of the CVD chamber 11 has a positioning recess 113 thereon configured (i.e. sized and shaped) to receive the positioning protrusion 173 (see FIG. 9). The shape and size of the positioning recess 113 correspond to those of the positioning protrusion 173, in some embodiments. With these configurations, the gas flow guiding member 17' can be secured the CVD chamber 11.

Many variations and modifications can be made to the gas flow guiding member 17' of the present disclosure. For example, the distance between one of the (first) gas outlet holes 17B of the gas flow guiding member 17' and the gas inlet port 112 may be different from the distance between the other of the (first) gas outlet holes 17B and the gas inlet port 112. For another example, the sizes and/or shapes of the two gas outlet holes 17B of the gas flow guiding member 17' may be different. For example, the gas flow guiding member 17' may further have a plurality of (second) gas outlet holes 17C disposed between the two (first) gas outlet holes 17B, similar to the embodiments shown in FIG. 6. In addition, the (second) gas outlet holes 17C may be arranged at equal or unequal intervals. The size of the (second) gas outlet holes 17C may be different from (e.g., smaller than) or the same as the size of the (first) gas outlet holes 17B. These various configurations and their purpose have been illustrated above and thus are not repeated here. Referring back to FIG. 1, a gas exhaust port 111 is disposed on the sidewall 11C of the CVD chamber 11. In some embodiments, the cleaning plasmas or gases are evacuated from the CVD chamber 11 by the gas exhaust port 111 that is connected to an exhaust pump (not shown), after cleaning process. In some embodiments, the gas exhaust port 111 is a circular opening (FIG. 1) in the sidewall 11C to achieve better exhaust uniformity. However, the location, number, and structure of the gas exhaust port 111 can be changed or adjusted according to actual needs.

In FIG. 1, the CVD apparatus 10 further includes a controller 18 that is configured to control all the process conditions (such as the operation of the gas flow controllers connected to the pipes P1 and P2, the operation of the RF generator 14, etc.) during the cleaning process. In some embodiments, the controller 18 is a computer device including one or more processing units and one or more memory devices. The processing units can be implemented in numerous ways, such as with dedicated hardware, or with general-purpose hardware (e.g., a single processor, multiple processors or graphics processing units capable of parallel computations, etc.) that is programmed using microcode or software instructions to perform the functions recited herein. Each memory device can be a random access memory (RAM), a read-only memory (ROM) or the like.

Next, referring to FIG. 11, which is a flowchart of a CVD chamber cleaning method 1000, in accordance with some embodiments. For illustration purposes, the flow chart will be described along with the drawings shown in FIGS. 1-10. Some of the described operations can be replaced or eliminated in different embodiments. Alternatively, some operations may be added in different embodiments. The CVD chamber cleaning method 1000 includes a number of operations, such as operations 1001, 1002, and 1003.

In operation 1001, a gas flow guiding member (e.g., the gas flow guiding member 17 or 17') is provided inside the CVD chamber (e.g., the CVD chamber 11) and coupled to a gas inlet port (e.g., the gas inlet port 112) that is disposed on one (e.g., the sidewall 11C or the bottom wall 11B) of wall portions of the CVD chamber 11 and below a substrate support portion 12A of a pedestal 12 inside the CVD chamber 11, as shown in FIG. 1 or FIG. 9.

In some embodiments, the gas flow guiding member 17 is an elongated (and curved) pipe structure defining or having two (first) gas outlet holes 17B disposed at both ends of the pipe structure in the long-axis direction (and located on opposite sides of the pedestal 12), disposed adjacent to the bottom wall 11B, and extending along the (circular) sidewall 11C, as shown in FIGS. 1-4A and 5-7. In some embodiments, the gas flow guiding member 17' is an elongated (and curved) plate structure, disposed adjacent to the bottom wall 11B, and extended along the sidewall 11C, as shown in FIGS. 8-10. In particular, the gas flow guiding member 17' has a curved cross-section, and its upper edge 171 and lower edge 172 respectively connect to or contact the sidewall 11C and the bottom wall 11B so as to form a gas flow channel between the gas flow guiding member 17', the sidewall 11C, and the bottom wall 11B. The gas flow guiding member 17' defines two (first) gas outlet holes 17B disposed at both ends of the gas flow channel (i.e., the gas flow guiding member 17') in the long-axis direction and located on opposite sides of the pedestal 12. In some embodiments, a number of (second) gas outlet holes 17C are provided and disposed between the two (first) gas outlet holes 17B of the gas flow guiding member 17 or 17'.

In operation 1002, flowing cleaning gases to the gas inlet port (e.g., the gas inlet port 112). In some embodiments, the cleaning gases are cleaning plasmas. In some embodiments, as shown in FIG. 1, the (original) cleaning gases are supplied from a cleaning gas source 16 into a remote plasma generator 15 to form the cleaning plasmas. The (original) cleaning gases may be excited by RF power from the remote plasma generator 15 to form the cleaning plasmas. For example, the fluorine radicals are produced by exciting nitrogen trifluoride (NF3). In particular, the radicals are used to remove resides containing silicon, silicon oxide or silicon nitride on the wall portions of the CVD chamber 11. The residues are formed by processes such as CVD processes.

In some embodiments, the cleaning plasmas include inert gases and fluorine-containing gases with a volume ratio in a range from about 1/1 to about 10/1. In some embodiments, the cleaning plasmas include argon and nitrogen trifluoride (NF3) with a volume ratio in a range from about 1/1 to about 10/1. In some embodiments, the flow rate of argon is in a range from about 500 sccm to about 30000 sccm, and the flow rate of nitrogen trifluoride (NF3) is in a range from about 500 sccm to about 5000 sccm. If the flow rate is too high, the gas is wasted and uniformity of gas is bad. If the flow rate is too low, cleaning efficiency is bad.

In operation 1003, a cleaning process is performed to the CVD chamber (e.g., the CVD chamber 11) by dispensing the cleaning gases (e.g., the cleaning plasmas generated in a remote chamber of the remote plasma generator 15) into the CVD chamber 11 through the gas outlet holes (e.g., the (first) gas outlet holes 17B and the (second) gas outlet holes 17C) of the gas flow guiding member (e.g., the gas flow guiding member 17 or 17'). The gas flow guiding member 17 or 17' is configured to change the flow field of the cleaning gases from the gas inlet port 112 within the CVD chamber 11. As described above, the gas flow guiding member 17 or 17' improves the flow field uniformity of the cleaning gases (from the gas inlet port 112) within the CVD chamber 11, as well as the cleaning uniformity of the cleaning process.

As the gas flow guiding member 17 or 17' is disposed adjacent to the bottom wall 11B of the CVD chamber 11, the gas flow guiding member 17 or 17' uniformly dispenses (through its gas outlet holes) the cleaning gases from the gas inlet port 112 to a lower region of the CVD chamber 11 roughly between the substrate support portion 12A and the bottom wall 11B, to remove unwanted films residue or residues on the inner walls in the lower region of the CVD chamber 11, during the cleaning process.

In some embodiments, the CVD chamber cleaning method 1000 further includes an operation of flowing cleaning gases (e.g., the cleaning plasmas generated by the remote plasma generator 15) to another gas inlet port (e.g., the gas inlet port 110) disposed on atop wall (e.g., the top wall 11A) of the wall portions of the CVD chamber 11, as shown in FIG. 1. Also, the CVD chamber cleaning method 1000 includes an operation of uniformly dispensing the cleaning gases from the gas inlet port 110 through a gas distribution showerhead (e.g., the gas distribution showerhead 13) disposed adjacent to the top wall 11A, to clean the wall portions in an upper region of the CVD chamber 11 roughly between the substrate support portion 12A and the top wall 11A, during the cleaning process, as shown in FIG. 1. Note that the gas distribution showerhead 13 and the gas flow guiding member 17 or 17' are disposed on opposite sides of the substrate support portion 12A.

In some embodiments, the operation of dispensing the cleaning gases through the gas flow guiding member 17 or 17' to clean the inner walls in the lower region of the CVD chamber 11 and the operation of dispensing the cleaning gases through the gas distribution showerhead 13 to clean the inner walls in the upper region of the CVD chamber 11 are controllably (via the controller 18 in FIG. 1) performed at the same time or in sequence. In some embodiments, after the cleaning process (i.e., unwanted films or residue on the inner walls of the CVD chamber are all removed by the cleaning gases), the cleaning gases (e.g., the cleaning plasmas) are exhausted from the CVD chamber 11 by a gas exhaust port 111 on the sidewall 11C, as shown in FIG. 1.

The embodiments of the present disclosure have some advantageous features: By disposing a gas flow guiding member (with a number of gas outlet holes) inside the CVD chamber to dispense the cleaning gases from the single gas inlet port formed on the CVD chamber wall and below the substrate support portion, the flow field uniformity of the cleaning gases within a lower region of the CVD chamber is improved. Consequently, the performance e.g., the cleaning uniformity) of the cleaning process is also improved.

In some embodiments, a CVD apparatus is provided. The CVD apparatus includes a CVD chamber including multiple wall portions. A pedestal is disposed inside the CVD chamber and configured to support a substrate. A gas inlet port is disposed on one of the wall portions and below a substrate support portion of the pedestal. In addition, a gas flow guiding member is disposed inside the CVD chamber, coupled to the gas inlet port, and configured to dispense cleaning gases from the gas inlet port into the CVD chamber. The gas flow guiding member has a curved plate structure and is arranged to extend along a sidewall of the wall portions. The gas flow guiding member is elongated in a longitudinal direction, and defines two first gas outlet holes located at both ends of the gas flow guiding member in the longitudinal direction. The gas flow guiding member, the sidewall, and a bottom wall of the wall portions define directly adjacent and contacting surfaces of each of the two first gas outlet holes.

In some embodiments, a CVD apparatus is provided. The CVD apparatus includes a CVD chamber including a top wall, a bottom wall opposite the top wall, and a sidewall between the top wall and the bottom wall. A first gas inlet port is disposed on the top wall. A gas distribution shower-head is disposed adjacent to the top Tall and configured to dispense cleaning gases from the first gas inlet port into the CVD chamber. A second gas inlet port is disposed on the bottom wall or the sidewall adjacent to the bottom wall. In addition, a gas flow guiding member is disposed adjacent to the bottom wall, coupled to the second gas inlet port, acid configured to dispense cleaning gases from the second gas inlet port into the CVD chamber through a number of gas outlet holes. The gas flow guiding member has a curved plate structure and is arranged to extend along the sidewall. The gas flow guiding member is elongated in a longitudinal direction, and the gas outlet holes include two first gas outlet holes located at both ends of the gas flow guiding member in the longitudinal direction. The gas flow guiding member, the sidewall, and the bottom wall define directly adjacent and contacting surfaces of each of the two first gas outlet holes.

In some embodiments, a CVD apparatus is provided. The CVD apparatus includes a CVD chamber including a top wall, a bottom wall opposite the top wall, and a sidewall between the top wall and the bottom wall. A gas inlet port is disposed on the bottom wall or the sidewall adjacent to the bottom wall. In addition, a gas flow guiding member is disposed inside the CVD chamber, coupled to the gas inlet port, and configured to redirect cleaning gases from the gas inlet port into the CVD chamber. The gas flow guiding member is elongated in a longitudinal direction, extends along the sidewall, and has a non-tubular structure. When viewed in the longitudinal direction, the gas flow guiding member has an open cross-section with an upper edge and a lower edge on opposite sides thereof, and the upper edge and the lower edge are directly coupled to the inner surface of the sidewall and the inner surface of the bottom wall, respectively, to form a gas flow channel among the gas flow guiding member, the sidewall, and the bottom wall. Two first gas outlet holes are located at both ends of the gas flow channel in the longitudinal direction. The gas flow guiding member, the sidewall, and the bottom wall define directly adjacent and contacting surfaces of each of the two first gas outlet holes.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chemical vapor deposition (CVD) apparatus, comprising:
    a CVD chamber including a plurality of wall portions;
    a pedestal disposed inside the CVD chamber, configured to support a substrate;
    a gas inlet port disposed on and through one wall portion of the plurality of wall portions and below a substrate support portion of the pedestal; and
    a gas flow guiding member disposed inside the CVD chamber, coupled to the gas inlet port, and configured to redirect cleaning gases from the gas inlet port into the CVD chamber;
    wherein the gas flow guiding member has a curved plate structure and is arranged to extend along a sidewall of the plurality of wall portions,
    wherein the gas flow guiding member is elongated in a longitudinal direction, and defines two first gas outlet holes located at respective terminal end portions of the gas flow guiding member in the longitudinal direction,
    wherein the gas flow guiding member, the sidewall, and a bottom wall of the plurality of wall portions define directly adjacent and contacting surfaces of each of the two first gas outlet holes,
    wherein the gas flow guiding member has an upper edge and a lower edge in contact with the sidewall and the bottom wall, respectively,
    wherein the gas flow guiding member further has a protrusion extending horizontally outward from a portion of the upper edge of the gas flow guiding member, and the sidewall has a recess configured to receive and engage the protrusion, and
    wherein the protrusion is at the same level with the upper edge of the gas flow guiding member, which is the top of the gas flow guiding member.

2. The CVD apparatus as claimed in claim 1, wherein the gas flow guiding member is extended along the sidewall, and a predetermined angle is formed between the two first gas outlet holes in a top view.

3. The CVD apparatus as claimed in claim 1, wherein the gas flow guiding member further defines a plurality of second gas outlet holes disposed between the two first gas outlet holes.

4. The CVD apparatus as claimed in claim 3, wherein the plurality of second gas outlet holes are arranged at equal intervals.

5. The CVD apparatus as claimed in claim 1, wherein the two first gas outlet holes are positioned equidistant from the gas inlet port.

6. A chemical vapor deposition (CVD) apparatus, comprising:
    a CVD chamber including a top wall, a bottom wall opposite the top wall, and a sidewall between the top wall and the bottom wall;
    a pedestal disposed inside the CVD chamber, configured to support a substrate;
    a first gas inlet port disposed on the top wall above a substrate support portion of the pedestal;

a gas distribution showerhead disposed adjacent to the top wall, configured to dispense cleaning gases from the first gas inlet port into the CVD chamber;

a second gas inlet port disposed on and through the bottom wall or the sidewall adjacent to the bottom wall below the substrate support portion of the pedestal; and a gas flow guiding member disposed adjacent to the bottom wall, coupled to the second gas inlet port, and configured to redirect cleaning gases from the second gas inlet port into the CVD chamber through a plurality of gas outlet holes;

wherein the gas flow guiding member has a curved plate structure and is arranged to extend along the sidewall, wherein the gas flow guiding member is elongated in a longitudinal direction, and the plurality of gas outlet holes include two first gas outlet holes located at respective terminal end portions of the gas flow guiding member in the longitudinal direction, wherein the gas flow guiding member, the sidewall, and the bottom wall define directly adjacent and contacting surfaces of each of the two first gas outlet holes, wherein the gas flow guiding member has an upper edge and a lower edge in contact with the sidewall and the bottom wall, respectively, wherein the gas flow guiding member further has a protrusion extending horizontally outward from a portion of the upper edge of the gas flow guiding member, and the sidewall has a recess configured to receive and engage the protrusion, and wherein the protrusion is at the same level with the upper edge of the gas flow guiding member, which is the top of the gas flow guiding member.

7. The CVD apparatus as claimed in claim 6, wherein the pedestal is located in a center of the CVD chamber, and the two first gas outlet holes of the gas flow guiding member are located on opposite sides of the pedestal in a top view, so that the cleaning gases from the two first gas outlet holes flow around the pedestal and reach a portion of the sidewall located on the opposite side of the second gas inlet port relative to the pedestal.

8. The CVD apparatus as claimed in claim 6, wherein the plurality of gas outlet holes further includes a plurality of second gas outlet holes disposed between the two first gas outlet holes.

9. The CVD apparatus as claimed in claim 8, wherein the plurality of second gas outlet holes are arranged at unequal intervals.

10. The CVD apparatus as claimed in claim 6, wherein the two first gas outlet holes are positioned equidistant from the second gas inlet port.

11. The CVD apparatus as claimed in claim 6, wherein the two first gas outlet holes are positioned at different distances from the second gas inlet port.

12. A chemical vapor deposition (CVD) apparatus, comprising:

a CVD chamber including a top wall, a bottom wall opposite the top wall, and a sidewall between the top wall and the bottom wall;

a pedestal disposed inside the CVD chamber, configured to support a substrate;

a gas inlet port disposed on and through the bottom wall or the sidewall adjacent to the bottom wall below a substrate support portion of the pedestal; and a gas flow guiding member disposed inside the CVD chamber, coupled to the gas inlet port, and configured to redirect cleaning gases from the gas inlet port into the CVD chamber;

wherein the gas flow guiding member, being elongated in a longitudinal direction, extends along the sidewall and has a non-tubular structure, wherein when viewed in the longitudinal direction, the gas flow guiding member has an open cross-section with an upper edge and a lower edge on opposite sides thereof, and the upper edge and the lower edge are directly coupled to an inner surface of the sidewall and an inner surface of the bottom wall, respectively, to form a gas flow channel among the gas flow guiding member, the sidewall, and the bottom wall, and wherein two first gas outlet holes are located at respective terminal end portions of the gas flow channel in the longitudinal direction, wherein the gas flow guiding member, the sidewall, and the bottom wall define directly adjacent and contacting surfaces of each of the two first gas outlet holes, wherein the gas flow guiding member further has a protrusion extending horizontally outward from a portion of the upper edge of the gas flow guiding member, and the sidewall has a recess configured to receive and engage the protrusion, and wherein the protrusion is at the same level with the upper edge of the gas flow guiding member, which is the top of the gas flow guiding member.

13. The CVD apparatus as claimed in claim 12, wherein the cross-section of the non-tubular structure is in a quarter-circle shape or a half-U shape.

14. The CVD apparatus as claimed in claim 12, wherein the non-tubular structure is an elongated and curved plate structure.

15. The CVD apparatus as claimed in claim 12, wherein the cross-section of the entire gas flow guiding member is substantially the same in shape and size.

16. The CVD apparatus as claimed in claim 12, wherein the two first gas outlet holes of the gas flow guiding member are located on opposite sides of the pedestal in a top view, so that the cleaning gases from the two first gas outlet holes flow around the pedestal and reach a portion of the sidewall located on the opposite side of the gas inlet port relative to the pedestal.

17. The CVD apparatus as claimed in claim 12, wherein the two first gas outlet holes are positioned equidistant from the gas inlet port.

18. The CVD apparatus as claimed in claim 12, wherein the two first gas outlet holes are positioned at different distances from the gas inlet port.

19. The CVD apparatus as claimed in claim 1, wherein when viewed in the longitudinal direction, the gas flow guiding member has a non-tubular structure.

20. The CVD apparatus as claimed in claim 19, wherein when viewed in the longitudinal direction, a cross-section of the non-tubular structure is in a quarter-circle shape or a half-U shape.

* * * * *